United States Patent [19]

Myrick

[11] Patent Number: 4,751,193

[45] Date of Patent: Jun. 14, 1988

[54] METHOD OF MAKING SOI RECRYSTALLIZED LAYERS BY SHORT SPATIALLY UNIFORM LIGHT PULSES

[75] Inventor: James J. Myrick, Glencoe, Ill.

[73] Assignee: Q-Dot, Inc., Colorado Springs, Colo.

[21] Appl. No.: 916,817

[22] Filed: Oct. 9, 1986

[51] Int. Cl.[4] .................. H01L 21/265; H01L 21/208
[52] U.S. Cl. ........................................ 437/19; 156/603;
156/DIG. 80; 427/53.1; 437/21; 437/84;
148/DIG. 4; 148/DIG. 93; 148/DIG. 77
[58] Field of Search ................ 29/571, 576 B, 576 T;
148/1.5, 175, 176, 187; 156/603, DIG. 80;
427/53.1; 437/19

[56] References Cited

U.S. PATENT DOCUMENTS

| 4,350,537 | 9/1982 | Young et al. | 148/1.5 |
| 4,356,384 | 10/1982 | Gat | 148/1.5 |
| 4,461,670 | 7/1984 | Celler et al. | 156/603 |
| 4,482,393 | 11/1984 | Nishiyama et al. | 148/1.5 |
| 4,564,403 | 1/1986 | Hayafuji et al. | 437/17 |
| 4,662,949 | 5/1987 | Inoue et al. | 156/612 |

FOREIGN PATENT DOCUMENTS

| 0221207 | 4/1985 | German Democratic Rep. | 148/DIG. 4 |
| 0033832 | 2/1983 | Japan | 148/DIG. 4 |

OTHER PUBLICATIONS

Dutartre, Appl. Phys. Letts. 48, (1986) 350.
Downer et al, Phys. Rev. Letts. 56, (1986) 761.
Seidel et al, J. Appl. Phys. 57, (1985) 1317.
Scharff et al, Phys. Stet. Solidi 74a, (1982) 545.
Robinson et al, in Mat. Res. Soc. Symp. 33, (1984) p. 71, ed. Lam et al.
Usami et al, IEEE Electron Device Letts. EDL-4, (1983) 166.
Cohen et al, Appl. Phys. Letts. 33, (1978) 751.
Bomke et al, Appl. Phys. Letts. 33, (1978) 955.

Primary Examiner—Upendra Roy
Attorney, Agent, or Firm—Fitch, Even, Tabin & Flannery

[57] ABSTRACT

Method is provided for manufacturing large crystalline and monocrystalline semiconductor-on-insulator devices.

2 Claims, 2 Drawing Sheets

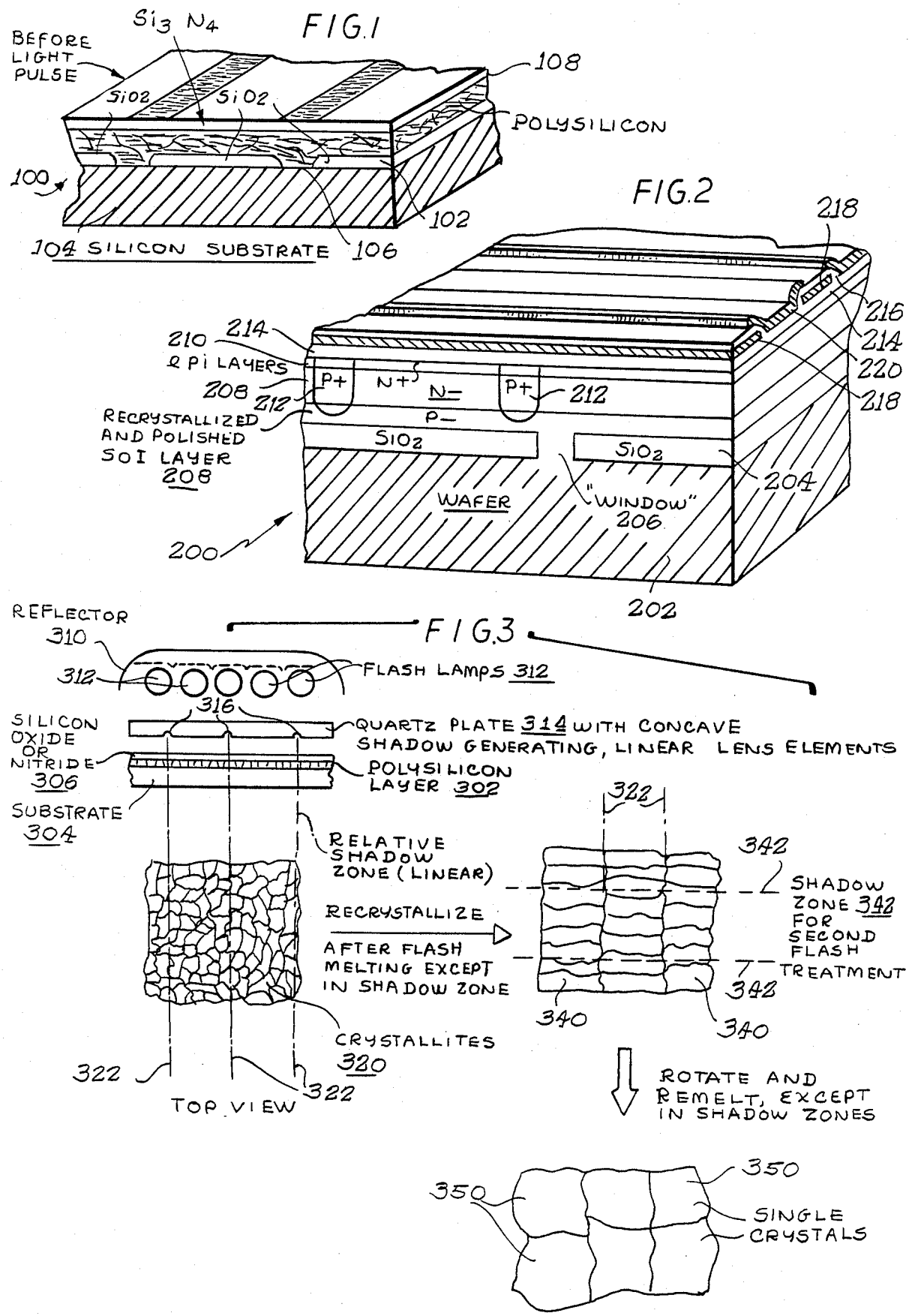

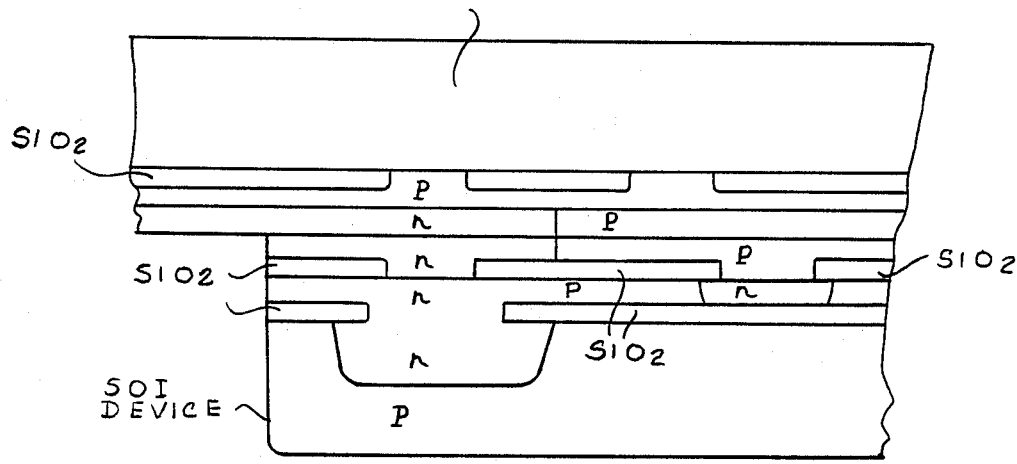
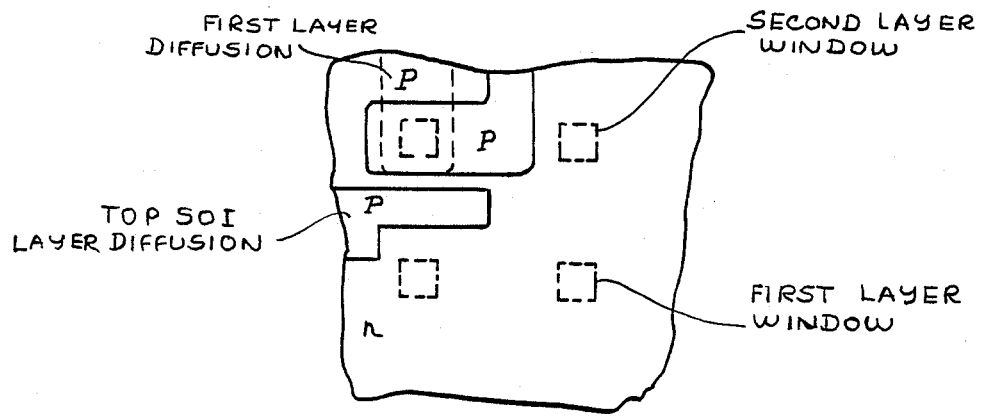

METHOD OF MAKING SOI RECRYSTALLIZED LAYERS BY SHORT SPATIALLY UNIFORM LIGHT PULSES

BACKGROUND OF THE INVENTION

This invention relates to methods of manufacturing large crystalline and monocrystalline semiconductor-on-insulator composites, and integrated circuits utilizing such composites.

There has been substantial work done in an effort to grow device-worthy silicon crystals on insulating substrates to provide latch-up free integrated circuits having low sensitivity to ion radiation, low capacitance, and high packing density for very large scale IC's [Leamy, et al., "Laser Fabrication of Silicon on Dielectric Substrates" Proceedings of the Materials Research Society Annual Meeting, Boston, MA, Nov. 16-19, 1981, North-Holland, Amsterdam, Netherlands, pp. 459-504, 1982]. Typically, polysilicon or amorphous silicon is recrystallized on a layer of silicon dioxide through contact windows to a monocrystalline substrate. Such recrystallization has been accomplished by laser beam scanning and by the application of halogen lamps, in a scanning arrangement or by application to the entire wafer over an extended time period. Very close control of the temperature profile is a crucial parameter.

Patterned antireflection coatings have also been used to define single crystal island areas. A laser beam is then scanned parallel to the anti-reflective stripes thereby producing a single crystal silicon island between the antireflective strips [See e.g., J. P. Colinge, et al., "Use of Selective Annealing for Growing Very Large Grain Silcon-On-Insulator", Applied Physics Letter, Vol. 41, No. 14, pp. 346-347, August, 1982; J. P. Colinge, et al., "Transistors Made in Single-Crystal SOI Films", IEEE Electron Device Letters, Vol. EDL-4, No. 4, April, 1983]. Various methods for growing monocrystaline silicon on dielectric substrates or layers are described in the literature [G. K. Celler, et al., "Seeded Oscillatory Growth of Si over SiO2 by CW Laser Irradiation", Applied Physics Letter, Vol. 40, No. 12, June, 1983; C. M. Kyung, "Temperature Profile of a Silicon-On-Insulator Multilayer Structure in Silicon Recrystallization with Incoherent Light Source", IEEE Trans. Electron Devices, Vol. ED-31, No. 12, pp. 1845-1851, December 1984; T. Stultz, et al., "Beam Processing of Silicon with a Scanning CW Hg Lamp", Elsevier, N.Y., pp. d463-76, 1983; D. Bensahel, et al., "Localization of Defects on SOI Films via Selective Recrystallization Using Halogen Lamps", Electron Lett., Vol. 19, No. 13, pp. 464-466, June 23, 1983; H. J. Leamy, et al., "Laser Fabrication of Silicon on Dielectric Substrates" Proceedings of the Materials Research Society Annual Meeting, Boston, MA, Nov. 16-19, 1981, North-Holland, Amsterdam, Netherlands, pp. 459-504, 1982.

However, these techniques have various disadvantages in terms of cost, and/or device properties or quality. For example, laser scanning techniques are costly and present difficulty in obtaining high quality single crystal silicon near the edges of the beam. In addition, overlapped successive scans can destroy the single crystal produced by the earlier scans causing random nucleation in the overlap region.

Scanning or relatively slow heating of the amorphous or polysilicon layer by means of halogen lamps, tends to cause warping of the wafers, induces stress and imperfections in the recrystallized materials and permits impurity diffusion to the monocrystalline silicon.

In addition, formation of conventional semiconductor wafers of monocrystalline semiconductor material is severely size limited. The formation of large area, single crystal, or large crystal thin films upon suitable substrates, such as glass or fused quartz would be desirable for uses such as integrated circuits, display panels, and photoelectric power generating devices.

Accordingly, it is an object of the present invention to provide improved methods for manufacturing monocrystalline seeded semiconductor-on-insulator devices and structures, as well as the devices and structures themselves. It is a further object to provide economical methods for producing highly crystalline seminconductor surfaces for large area use such as solar power cells. It is a further object to provide improved integrated circuit and other semiconductor electronic devices. These and other objects will be apparent from the following drawings and description.

BRIEF DESCRIPTION OF THE DRAWINGS

FIG. 1 is a cross sectional illustration of a layered semiconductor system during an intermediate processing step in accordance with an embodiment of a method in accordance with the present invention;

FIG. 2 is a cross sectional view of a charge coupled device manufactured from SOI wafer system produced with the present invention from a wafer system of the type illustrated in FIG. 1;

FIG. 3 is a semi-schematic process illustration of an embodiment of unseeded SOI manufacture in accordance with the present invention;

FIG. 4 is a cross sectional view of a semiconductor device in accordance with the present invention which has been bonded to a monocrystalline carrier; and FIG. 5 is a top view of a multilayer SOI device showing inter-SOI layer connection.

DESCRIPTION OF THE INVENTION

By applying one or more intense flashes of incoherent light, in a time which is small (e.g., in the range of from about one nanosecond to about 10 milliseconds, such as from about 0.1 to about 5 milliseconds) in respect to thermal conduction through an insulator layer, of sufficient intensity to melt an amorphous silicon or polysilicon layer except at seed windows, precise recrystallization control may be obtained.

For example, as shown in FIG. 1, a thermal oxide layer 102 (e.g., in the range of from about 0.5 to about 2 microns thick) may be grown atop a standard, polished and etched bulk-silicon wafer (100) 104. Regularly patterned (e.g., square or linear) windows are etched through the oxide, and polysilicon or amorphous silicon are deposited on the wafer to a predetermined thickness in the range of from about 1 to about 15 microns. The windows are in the range of from about 1 to about 15 microns wide, and are in the form of an array separated by from about 25 to about 80 micron distance in a (100) orientation along their length. A protective silicon nitride layer 108 is provided over the amorphous or polysilicon layer to maintain the shape of the layer after it is melted, and during recrystallization. Furthermore, by encapsulating the patterned areas prior to the laser annealing step, the dimensional stability, surface texture and planarity of the discrete areas are controlled. After patterning a suitable capping layer is deposited and, subsequent to crystallization, the capping layer is removed so that subsequent known processing steps are implemented to form active devices on the array of single crystal islands. In this regard, silicon undergoes a significant (e.g., 20%) increase in volume upon crystallization, and would otherwise tend to "bead up" because of poor wetting properties on a silicon dioxide surface layer 102.

A spatially uniform (e.g., 5% power deviation over the surface to be melted) intense light pulse, which may be an incoherent flashlamp pulse is applied to melt the amorphous or polysilicon layer, so that a small portion of the monocrystalline substrate is also melted through the windows. The amount of power will depend on the substrate temperature, the polysilicon thickness and the environment temperature, and may readily be determined. The flashlamp may typically have a spectral emission characteristic similar to black body radiation at a temperature in the range of from about, 7,000° K. to about 9,500° K.

High power flash lamps or pulsed free electron laser pulsed light systems may be provided in accordance with conventional practice, with particular attention to the design of light distribution or reflection systems which provide a substantially uniform energy distribution at the surface to be treated [e.g., T. Xingii; et al., "A High Power Vortex Gas Flow Stabilized Flashlamp", Chin. Phys., Vol. 4, No. 1, pp. 131–136, January–March 1984; G. Bagnasco, et al., "Two Frequency Self-Injected Flashlamp Pumped Dye Laser for Nonlinear Optics Experiments", IEEE J. Quantum Electron., Vol. QE-19, No. 2, pp. 202–208, February, 1983; T. Yunglu, "Generation of UV Picosecond High Power Laser Pulses for Laser-Produced Plasma Diagnosis", Laser J., Vol. 9, No. 10, pp. 625–628, Oct. 20, 1982; M. Maeda, et al., "Amplification of UV Picosecond Pulses by Excimer Lasers", Oyo Buturi, Vol. 49, No. 11, pp. 1107–1116, November 1980; R. C. Knight, "Efficient Burst-Mode Operation of a Very High Repetition Rate Nd: YAG Laser", J. Phys. E., Vol. 13, No. 12, pp. 1339–1342, December 1980; B. M. Carder, et al., "Applying a Compensated Pulse Alternator to a Flashlamp Load for Nova", 2nd IEEE International Pulsed Power Conference Digest of Papers, Lubbock, Tex., June 12–14, 1979, IEEE, New York, pp. 459–462, 1979; and J. Jethwa, et al., "A Reliable High Average Power Dye Laser", 1977 IEEE/OSA Conference on Laser Engineering and Applications, June 1–3, 1977, Vol. QE-13, No. 9, pp. 29–30 September 1977].

Desirably, the light pulse application is carried out in an inert atmosphere, such as an argon atmosphere. The absorption characteristics of the "window" structure of the embodiment 100 are different from the "layer" structure. For example, approximately 35% of the incoming power absorbed in the "window" structure and 25% of the incoming power is absorbed in the layered structure [Transactions on Electron Devices, December, 1984, pp. 18–45, 18–50] so that the heat energy deposited at the window structure may be significantly greater than that in the "layer" structure. By directing a spatially uniform light pulse to the polysilicon layer, in accordance with the methods of the present invention, the polysilicon layer is substantially instantaneously melted together with a small portion of the substrate at the "window". During processing, the entire wafer is preferably maintained at an elevated temperature below the melting point of silicon (e.g., 1100°–1300° C.) such that cooling of the melted layer will be at a rate appropriate to crystallization in a monocrystalline manner from the window zones, across the top of the wafer. The nitride layer are removed and the recrystallized layer are etched, polished and processed to produce integrated circuits in accordance with conventional procedures. Imperfections are located at zones intermediate the "windows" and are avoided in circuit design.

The high conductivity of molten silicon, together with the relatively low conductivity of the silicon dioxide layer, will provide a relatively uniform temperature to the molten silicon produced by the light pulse. However, over the crystallization window, which initially receives more input power, direct conduction to the bulk silicon will more rapidly reduce the temperature of the molten silicon layer to a crystallization temperature. Heat conduction from the monocrystalline zone will continue propagation of the monocrystalline layer.

One or more subsequent light pulses which are insufficient in energy to melt the top silicon layer, may be applied to maintain the appropriate monocrystallization fronts from the seed regions.

The present methods find particular utility in both the VLSI integrated circuit area, and in the solar cell industry.

Such SOI composite structures may be utilized in accordance with the present invention to provide latch-up free integrated circuits, particularly integrated digital memory and microprocessor circuits and integrated analog circuitry such as operational amplifier systems, which have low sensitivity to ion radiation and high packing density.

Such composites may also be used in the manufacture of circuits such as charge couple devices which may also benefit from low capacitance effects. For example, illustrated in FIG. 2, is a charge coupled device (CCD) 200 which is fabricated from an SOI composite structure such as that produced form the layered structure of FIG. 1, following pulse recrystallization of the SOI layer. In this regard, the CCD 200 comprises a monocrystalline silicon [100] wafer 202 which may be a p-type wafer, upon which is formed an oxide dielectric layer 204 having windows 206 therein, as previously described. A p-type monocrystalline SOI layer 208 is formed by flashed light heating of a p-doped polycrystalline silicon layer, as also previously described, followed by removal of the upper nitride layer, mechanical and chemical polishing to a thickness in the range of 0.5 to about 2 microns and monocrystalline epitaxial deposition (and implantation) of n-silicon layer 208 and n+ silicon layer in accordance with conventional manufacturing procedures for buried channel charge coupled devices.

A p+ diffusion step similarly provides CCD channel diffusin stop 212 parallel to the window strips 206 defining a CCD channel region therebetween in a region of monocrystalline silicon of high quality.

Dielectric layers 214, 216 and transfer electrodes 218, 220 may be provided, also in accordance with conventional practice. A suitable BCCD signal input structure such as an input diode, and a suitable BCCD output structure such as a sense diode or a distributed floating gate amplifier also provided in the channel in accordance with conventional practice. The device 200 has very low capacitance, which provides for high speed operation, and is relatively insensitive to ionize radiation.

As also disclosed, the present methods may be utilized to produce large surface area semiconductor systems having large monocrystalline regions without "seeding" of the recrystallization zone. Substantial research has also been conducted to develop inexpensive methods for large scale manufacture of solar cells. Pulsed light might also be useful to inexpensively provide relatively large crystal polysilicon structures for solar cell use. The polysilicon or amorphous silicon layer is deposited directly on a suitable dielectric substrate (e.g., quartz glass), with an appropriate capping layer (e.g., silica or silicon nitride). A patterned light pulse, such as produced by suitable focusing elements, or by interposition of a shadowing grid, may be applied to the polysilicon to recrystallize it with a larger grain size than the as-deposited grain size. This step is repeated using an offset, or rotated pattern to further increase the grain size. In this regard, as shown in FIG. 3, an amorphous or polycrystalline layer 302 of a semiconductor such as doped or undoped silicon, is provided on a suitable substrate 304 such as optically polished, substantially pure fused quartz. A dielectric layer 306 such as a diamond-like carbon, $SiO_2$ or $Si_3N_4$ layer may be formed (e.g., grown or deposited) on the layer 302 in accordance with conventional techniques. A high intensity pulsed flashlamp assembly comprising a reflector 310, flashlamp 312 and associated circuitry (not shown) is disposed adjacent the outer surface of the layer 302.

A flashlamp assembly provides light pulses which are substantially uniform in energy, as previously discussed. Between the flashlamp assembly at a position immediately adjacent the dielectric surface 306 is a quartz plate 314 which is optically flat on its surface adjacent the lamp assembly. At its surface, adjacent the dielectric 306, a plurality of spaced apart, parallel, linear concave lense elements or grooves 316 are provided in the quartz plate. The grooves may be spaced apart a suitable distance, such as in the range of from about 100 to about 500 microns and may be of a suitable width such as from about 2 to about 20 microns and may be provided, for example, by photomasked etching techniques. The purpose of the concave shadow generating elements 316 is to provide linear, relative shadow zones on the polysilicon layer 302 when a light pulse is applied from the flashlamp assembly through the thin quartz plate 314 to the polysilicon layer 302.

A top view of the polysilicon, showing a large number of crystalites 320, in registration with the linear lens element 316 of the quartz plate is shown below the cross sectional view thereof in FIG. 3 (as labeled). Upon applying an intense light flash having sufficient energy to melt the crystalites 320 of the polysilicon layer 302, except in the shadow zones 322, provided by the lens elements 316, the silicon coated substrate will recrystallize from the shadow zones 322 into larger crystalites 340, as also shown in FIG. 3. By subsequently rotating the silicon coated substrate composite under the quartz plate 314 so that the newly oriented shadow zones 342 have a new alignment, again applying an intense light pulse to remelt the composite, substantially larger single crystals 350 may be provided upon recrystallization, as also shown in the FIGURE. A shadow-generating system having a different pattern may also be used for the repeated crystallization steps. The recrystallization step is preferably carried out at a desired, elevated substrate temperature, e.g., 500°–1200° C. in order to control the recrystallization rate.

Multiple SOI layers, each layer having integrated circuit devices formed therein, may be fabricated by repeated application of the above-described steps. The surfaces may be polished to optical flatness, provided with surface silanol groups, pressed together with another similar surface and bonded thereto at elevated temperature to form a carrier/device assembly which may provided for improved device connection. Moreover, other semiconductor materials such as gallium arsenide may be applied to similar or different substrates. Similarly, conductors such as nickel or a chromium disilicide may be formed in monocrystalline layers over a silicon substrate by using these methods.

What is claimed is:

1. A method for manufacturing a large crystalline or monocrystalline semiconductor-on-insulator device comprising the steps of providing an amorphous or polycrystalline semiconductor layer at least partially on an insulating substrate, depositing a dielectric layer atop the semiconductor layer, applying an intense pulse of light having a duration of from about 1 nanosecond to about 10 milliseconds to said semiconductor layer through said dielectric layer sufficient to melt at least a major portion of said layer, crystallizing the melted semiconductor layer to provide a crystallized layer having a larger crystal structure than said amorphous or polycrystalline semiconductor layer prior to melting thereof, applying a second intense patterned pulse of light having a duration of from about 1 nanosecond to about 10 milliseconds to remelt all but selected portions of said crystallized layer to provide remelted portions of said layer adjacent unmelted portions of said layer, and recrystallizing said remelted portions in a monocrystalline manner from said unmelted portions adjacent thereto to provide a semiconductor-on-insulator device having large crystalline or monocrystalline zones in said semiconductor layer.

2. A method for manufacturing a large crystalline or monocrystalline semiconductor-on-insulator wafer, comprising the steps of providing a monocrystalline semiconductor substrate wafer, providing a first dielectric layer on at least one major surface of said wafer, etching a plurality of window zones through said dielectric layer to said semiconductor substrate wafer, applying a polycrystalline or amorphous semiconductor layer atop said dielectric layer in contact with said semiconductor substrate at said window zones, applying a second dielectric layer atop said semiconductor layer, heating said wafer and said deposited layers to an elevated temperature below the melting point of the semiconductor wafer substrate, applying an intense pulse of light having a duration of from about 1 nanosecond to about 10 milliseconds to said amorphous or polycrystalline semiconductor layer which is spatially uniform across said wafer sufficient to substantially instantaneously melt the semiconductor layer together with a small portion of the semiconductor substrate at the window zones, preferentially conducting heat from the melted semiconductor layer at the window zones to rapidly reduce the temperature of the molten semiconductor layer to a crystallization temperature, crystallizing the melted layer in a monocrystalline manner from the window zones across the top of the wafer over the first dielectric layer to provide a thin monocrystalline semiconductor layer in zones over the first dielectric layer between the window zones, and removing the second dielectric layer to provide a substantially monocrystalline semiconductor-on-insulator structure and fabricating semiconductor integrated circuit devices in the thin monocrystalline layer intermediate the window zones.

* * * * *